(12) United States Patent
Gronau et al.

(10) Patent No.: US 10,288,409 B2
(45) Date of Patent: May 14, 2019

(54) TEMPERATURE SENSITIVE LOCATION ERROR COMPENSATION

(71) Applicant: APPLIED MATERIALS ISRAEL LTD., Rehovot (IL)

(72) Inventors: Yuval Gronau, Ramat Hasharon (IL); Chun-Hsiang Yen, Magong (TW); Barak Dee-Noor, Herzelia (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 257 days.

(21) Appl. No.: 14/676,571

(22) Filed: Apr. 1, 2015

(65) Prior Publication Data

US 2016/0290786 A1    Oct. 6, 2016

(51) Int. Cl.
| | |
|---|---|
| *G01B 11/02* | (2006.01) |
| *G01B 11/00* | (2006.01) |
| *F16M 11/42* | (2006.01) |
| *H01L 21/67* | (2006.01) |
| *H01L 21/687* | (2006.01) |

(52) U.S. Cl.
CPC .......... *G01B 11/002* (2013.01); *F16M 11/42* (2013.01); *H01L 21/67248* (2013.01); *H01L 21/68764* (2013.01)

(58) Field of Classification Search
None
See application file for complete search history.

(56) References Cited

U.S. PATENT DOCUMENTS

| | | | | |
|---|---|---|---|---|
| 5,270,771 A | * | 12/1993 | Sato | G03F 7/70241 355/30 |
| 6,819,404 B2 | * | 11/2004 | Tanaka | G03F 7/70716 355/53 |
| 2004/0036861 A1 | * | 2/2004 | Yoshioka | G01R 31/2891 356/237.1 |
| 2007/0153244 A1 | * | 7/2007 | Maria Zaal | G03F 7/70341 355/30 |
| 2007/0164770 A1 | * | 7/2007 | Casler, Jr. | G01R 31/2891 324/750.22 |
| 2009/0268021 A1 | * | 10/2009 | Kawaragi | G01B 11/002 348/87 |
| 2015/0200071 A1 | * | 7/2015 | Sender | H01J 37/265 250/307 |

* cited by examiner

*Primary Examiner* — James G Norman
(74) *Attorney, Agent, or Firm* — Kilpatrick Townsend & Stockton LLP

(57) ABSTRACT

A system that may include a movable support module for supporting an object and a controller, wherein the controller is configured to: receive an estimated location of a movable support module that supports an object and temperature information about an actual or estimated temperature of at least a portion of the object support module; and calculate movable support module location information, in response to (a) the estimated location of the movable support module, (b) the temperature information, and (c) a mapping between (i) values of the temperature information, (ii) estimated locations of the movable support module, and (iii) location errors of the movable support module.

19 Claims, 10 Drawing Sheets

TEMPERATURE SENSITIVE LOCATION ERROR COMPENSATION

BACKGROUND OF THE INVENTION

Objects such as wafers are manufactured by highly complicated manufacturing processes. These manufacturing processes should be monitored in order to ensure the quality of the wafers.

Monitoring process may include (a) using an inspection tool for performing an inspection process to detect potential defects, and (b) using a review tool for performing a review of the potential defects.

The inspection tool may illuminate the object by one or more beams of electrons, ions or by one or more beams of optical, ultraviolet, deep ultraviolet or extreme ultraviolet radiation. The review tool usually illuminates the objects using one or more electron beams or one or more an ion beams.

Each tool of the inspection tool and the review tool may scan the object (or only parts of the object) by introducing a mechanical movement between the object and either the optical or electron optics.

The mechanical movement is usually introduced by a movable support module that may be a mechanical stage. The mechanical stage may be an XYZ stage that is configured to support the object and to move the object along imaginary X axis, Y axis and Z axis.

The mechanical stage location is monitored by X axis and Y axis laser interferometers.

It has been found that laser interferometer based monitoring does not provide adequate compensation for mechanical stage movement inaccuracies.

There is a growing need to provide a method for reducing the location errors in an inspection or review tool.

BRIEF SUMMARY OF THE INVENTION

According to an embodiment of the invention there may be provided a system that may include a movable support module for supporting an object and a controller, wherein the controller may be configured to: receive (a) an estimated location of a movable support module that supports an object, (b) temperature information about an actual or estimated temperature of at least a portion of the object support module; and calculate movable support module location information, in response to (a) the estimated location of the movable support module, (b) the temperature information and, (c) a mapping between (i) values of the temperature information, (ii) estimated locations of the movable support module, and (iii) location errors of the movable support module.

The controller may be configured to calculate the mapping.

According to an embodiment of the invention there may be provided a method for temperature sensitive location error compensation, the method may include: receiving, by a controller, (a) an estimated location of a movable support module that supports an object, (b) temperature information about an actual or estimated temperature of at least a portion of the object support module; and calculating, by the controller, movable support module location information, in response to (a) the estimated location of the movable support module, (b) the temperature information and, (c) a mapping between (i) values of the temperature information, (ii) locations of the movable support module, and (iii) location errors of the movable support module.

The method may include calculating a location of an optical axis of an inspection or review tool in response to the movable support module location information.

The method may include generating the mapping by measuring the location errors of the movable support module at different actual or estimated temperatures of the movable support module.

The method may include heating the movable support module by a heating element to obtain at least some of the different actual or estimated temperatures of the movable support module.

The method may include heating the movable support module by moving the movable support module during a period of time that exceeds a predetermined threshold to obtain at least some of the different actual or estimated temperatures of the movable support module.

The method may include cooling the movable support module by a cooling element to obtain at least some of the different actual or estimated temperatures of the movable support module.

The estimated location of the movable support module may be provided by a location monitor; wherein the temperature information may be provided by a temperature sensor that may be located at a certain position; wherein the generating of the mapping may include estimating a relationship between a temperature sensed by the temperature sensor and a temperature of a part of the location monitor.

The method may include receiving the temperature information from a temperature sensor that senses a temperature of a certain portion of the object support module.

The method may include receiving the temperature information from multiple temperature sensors that sense temperatures of certain portions of the object support module.

The method may include receiving temperature timing information about a timing of acquisition of the temperature information; and wherein the calculating of the movable support module location information may be also responsive to the temperature timing information.

The method may include calculating a change of the temperature information over time; and wherein the calculating of the movable support module location information may be also responsive to the change of the temperature timing information over time.

The method may include: receiving or calculating a relationship between a scan pattern that may be followed by the movable support module and between temperatures obtained during the scan pattern; detecting that the movable support module started to follow the scan pattern; and calculating the movable support module location information in response to the relationship.

The movable support module may include an X-Y axis stage and a Z axis stage; wherein the movable support module location information may be indicative of a location of the movable support module within an X-Y plane; and wherein the temperature information may be provided by temperature sensors embedded in the Z axis stage.

According to an embodiment of the invention there may be provided a non-transitory computer readable medium that may store instructions that once executed by a computer cause the computer to receive (a) an estimated location of a movable support module that supports an object, (b) temperature information about an actual or estimated temperature of at least a portion of the object support module; and calculate movable support module location information, in response to (a) the estimate location of the movable support module, (b) the temperature information and, (c) a mapping between (i) values of the temperature information, (ii)

estimate locations of the movable support module, and (iii) location errors of the movable support module.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
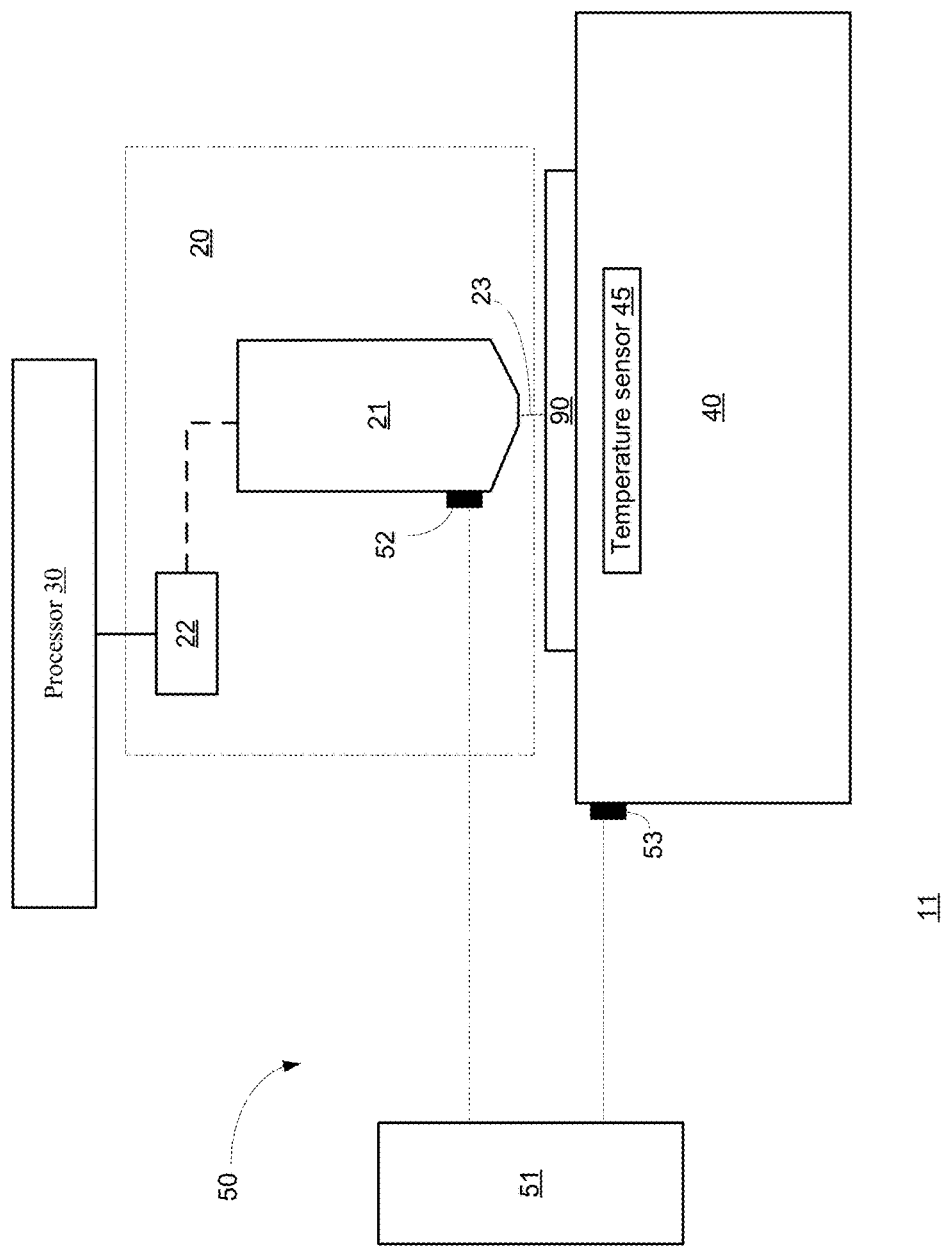
FIG. 1 is a side view of a system according to an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

FIG. 1 is a side view of system 11 that supports an object 90 according to an embodiment of the invention. System 11 may be an inspection tool (optical inspection tool or charged particle beam inspection tool), a review tool (such as but not limited to a scanning electron microscope, a transmissive electron microscope), an aerial inspection tool, a stepper, a lithography tool, an atomic force microscope (AFM), and the like.

System 11 includes an image obtaining module 20, a processor 30, a mechanical stage 40 for supporting and moving an object 90, and a location monitor 50 for monitoring the location of the mechanical stage 40. The object may 90 be a wafer, a die, a flat panel display, a photolithographic mask, a solar panel, a micro-electro-mechanical-system, a nano-electro-mechanical-system, a substrate or any other object.

Image obtaining module 20 may include a controller 22 and optics 21. The optics 21 are arranged to illuminate the entire object or only parts of the object 90 with one or more beams. For simplicity of explanation it is assumed that the optics 21 is charged particles optics and that they illuminate the object with a single electron beam. The optics 21 has an optical axis 23. The electron beam may propagate along the optical axis 23 or may be deflected to deviate from the optical axis 23.

The location monitor 50 of FIG. 1 is a laser interferometer that includes laser optics 51, first mirror 52 and second mirror 53. The first mirror 52 is attached to the optics 21 while the second mirror 53 is attached to an upper part of mechanical stage 40. The laser optics 51 are arranged to direct a first light beam towards the first mirror 52 and to direct a second light beam towards the second mirror 53. The first mirror 52 and the second mirror 53 reflect the first and second light beams towards the laser optics 51. The reflected beams from the first and second mirror interfere and form an interference pattern that is detected by the laser optics 51. It is noted that any other type of location monitor may be used and the laser interferometer is only one non-limiting example of a location monitor.

The optic 21 may be static and the mechanical stage 40 may move in relation to the optics 21.

The laser optics 51 may process the interference pattern to provide distance between the first mirror 52 and second mirror 53. This distance reflects an estimated distance between optics 21 and the mechanical stage 40.

The distance also reflects the estimated location of the mechanical stage 40 and/or the estimated location of the optical axis 23 of optic 21. The controller 22 is fed with a relationship between the point of incidence of the electron beam on the object and the optical axis 23 (whether optics 21 deflected the beam of electrons and if so—the extent of deflection) and may estimate the location of the point of incidence of the electron beam on the object.

The mechanical stage 40 may include a temperature sensor 45 that measures a temperature of at least one point of the mechanical stage 40. The temperature sensor 45 may be integrated with the mechanical stage 40, may be connected to the mechanical stage or may be thermally coupled to the mechanical stage 40.

It is noted that the temperature sensor 45 may not be included within the mechanical stage 40 and may measure the temperature of at least one point of the mechanical stage 40 even without contacting the mechanical stage 40.

It has been found that the estimated location of the mechanical stage 40 is dependent upon the temperature of various parts of the system—such as the temperatures of different points of the mechanical stage 40 and the temperatures of different points of the location monitor 50.

Especially—at higher temperatures the mechanical stage 40, the object 90 and the location monitor 50 (especially first mirror 52 and/or second mirror 53) tend to undergo a non-homogenous and non-linear deformation that results in location errors. The deformation may change from one temperature to another and from one review tool to another.

Figure 9:
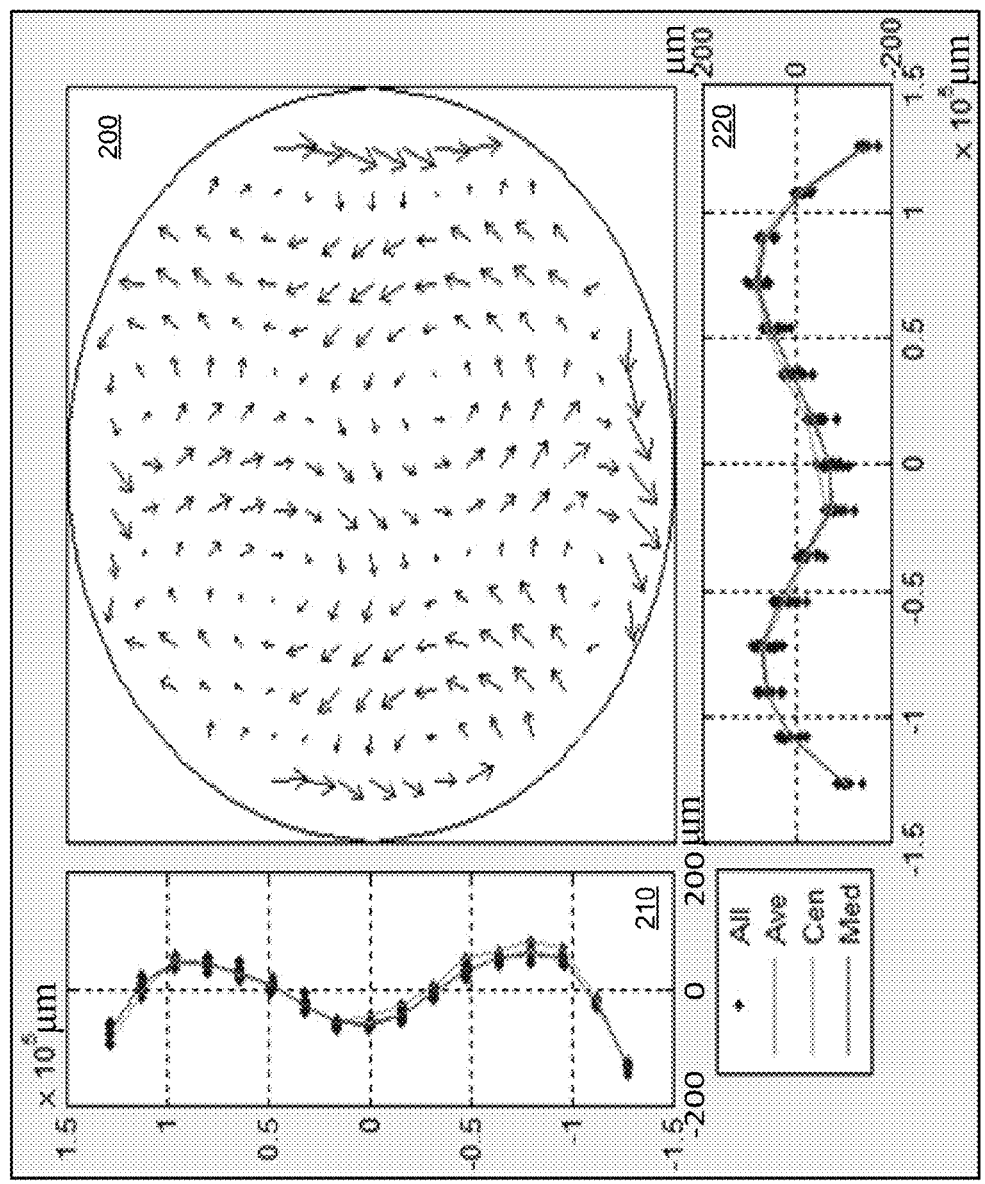
FIG. 9 illustrates location errors before applying a temperature sensitive location error correction.

The deformation is termed non-homogenous as different parts of the object 90, of the mechanical stage 40 and/or the location monitor 50 are deformed at different manners. For example—FIG. 9 illustrates a map 200 that includes arrows that are indicative of the location errors at different points of the mechanical stage 40. The locations errors differ from one point to another.

It should be noted that the deformation of the mechanical stage 40 may differ from the deformation of the first and second mirrors—due to the different materials and/or different structure of the mechanical stage 40 and the first and second mirrors.

According to an embodiment of the invention the controller 22 receives from the laser optic 51 an estimated location of the mechanical stage 40. The controller 22 may also receive temperature information about an actual temperature of at least one point of the mechanical stage 40 from the temperature sensor 45.

In order to determine the exact location of the mechanical stage 40—and the exact location of the optical axis 23 of the optics 21—the controller 22 may use a mapping between (i) values of the temperature information, (ii) estimated locations of the movable support module, and (iii) location errors of the movable support module.

The controller 22 may generate movable support module location information that reflects the exact location of the movable support module and may use the movable support module location information for controlling an image acquisition process applied by optics 21.

The mapping may be a function, may be a group of functions, may be a look up table or may be arranged in any manner. For example, the function may take the following format:

Correct(X,Y)=MAP {Estimated (X,Y), Temperature}.

Wherein the exact XY coordinates are denoted Correct (X,Y), MAP is a mapping function, Estimated(X,Y) are estimated XY coordinates provided by laser optics 51, and Temperature represents the temperature information.

According to an embodiment of the invention the mapping function may also be responsive to the change of temperature over time and/or to timing information (such as timestamps) indicative of a time of acquisition of the temperature reading. In this case the mapping may take one of the following formats:

Correct(X,Y)=MAP{Estimated(X,Y), Temperature, Timestamps}.

Correct(X,Y)=MAP{Estimated(X,Y), Temperature, Delta-Temperature}.

Wherein timing information is denoted Timestamps and changes of temperatures over time is denoted Delta-Temperature.

A temperature sensor may sense the actual temperature of a certain point of the system 11. The actual temperature may affect the temperature of other points of the system 11—after a certain period of time. This period of time may be taken into account when processing the timestamps. For example—the temperature sensor 45 may sense an actual temperature of a certain point of the mechanical stage 40. This actual temperature may affect the temperature of the second mirror 53 after a certain delay and this delay will be taken into account. The temperature of the second mirror 53 is not measured and therefore is an estimated temperature.

The mapping may be calculated by processor 30 or received by processor 30. Additionally or alternatively, the mapping may be calculated or received by the controller 22.

Figure 2:
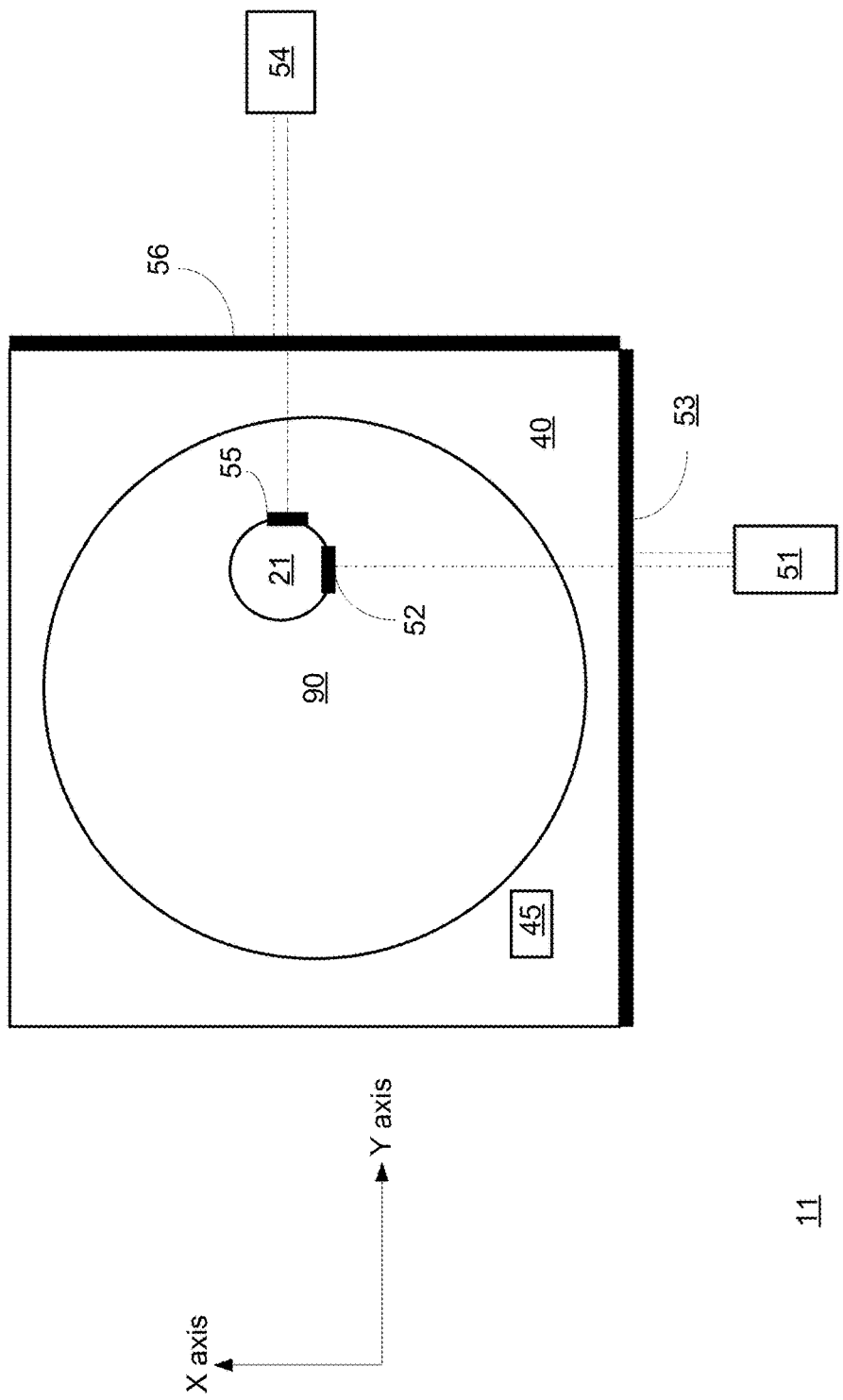
FIG. 2 is a top view of a system according to an embodiment of the invention.

FIG. 2 is a top view of system 11 that supports an object 90 according to an embodiment of the invention. FIG. 2 illustrates that a location monitor 50 that includes an X-axis interferometer (including laser optics 51 as well as a first mirror 52 and a second mirror 53) and a Y-axis interferometer that includes second laser optics 54 as well as a third mirror 55 and a fourth mirror 56. The third mirror 55 is attached to optics 21 while the fourth mirror 56 is attached to the mechanical stage 40.

The X-axis interferometer and the Y-axis interferometer operate at the same manner. The X-axis interferometer provides an estimated distance (along the X-axis) between the third mirror 55 and fourth mirror 56—which reflects an estimated distance (along the X-axis) between optics 21 and the mechanical stage 40. The Y-axis interferometer provides an estimated distance (along the Y-axis) between the first mirror 52 and a second mirror 53—which reflects an estimated distance (along the Y-axis) between optics 21 and the mechanical stage 40.

The controller 22, when calculating the movable support module location information may take into account the distances provided by X axis and Y axis interferometers.

Figure 3:
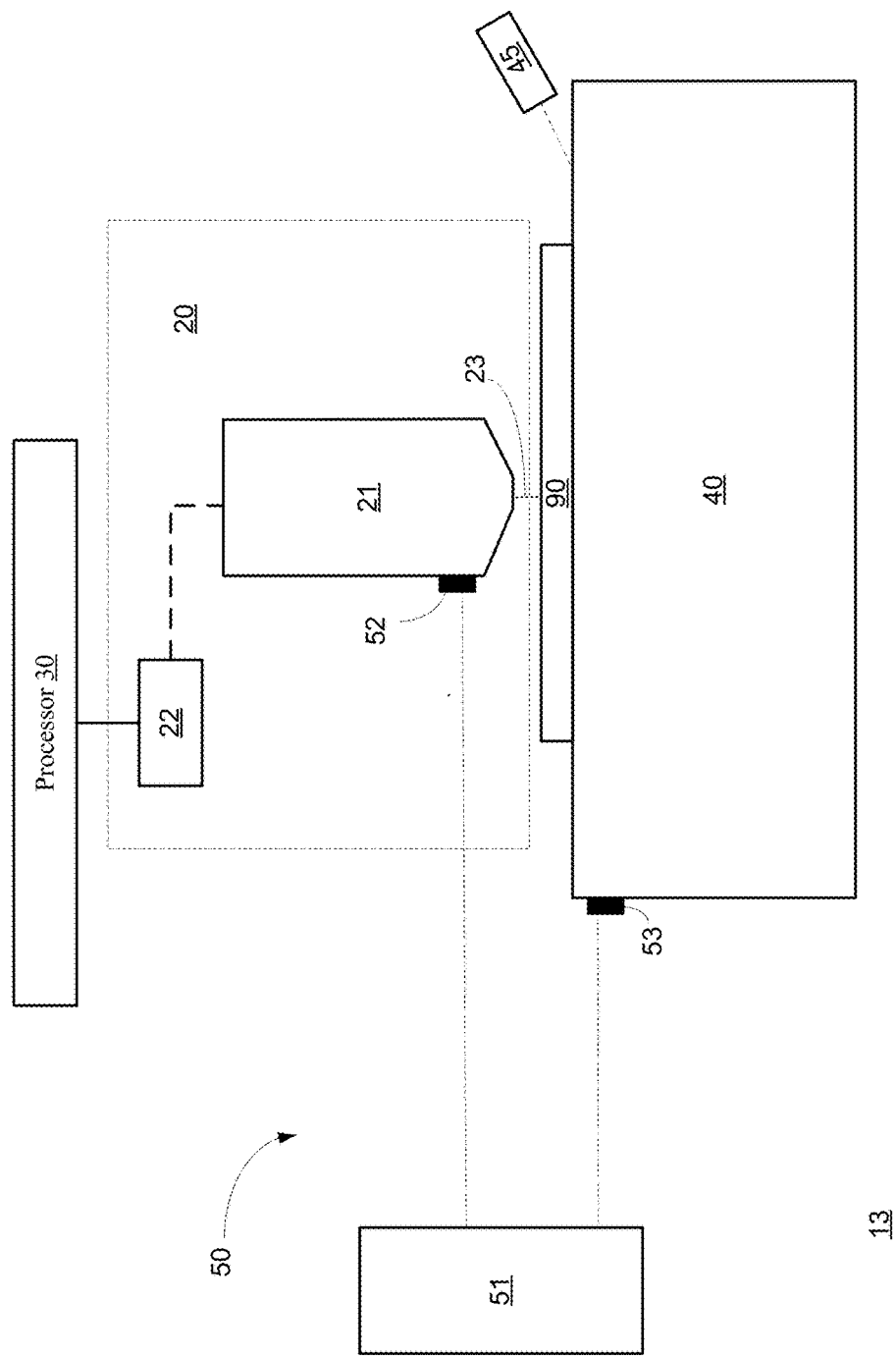
FIG. 3 is a side view of a system according to an embodiment of the invention.

FIG. 3 is a side view of system 13 that supports an object 90 according to an embodiment of the invention. System 13 differs from system 11 by having a temperature sensor 45 that is a contactless temperature sensor and measures an actual temperature of one or more points of the mechanical stage without contacting the mechanical stage—instead of having a temperature sensor 45 that is included in the mechanical stage 40.

Figure 4:
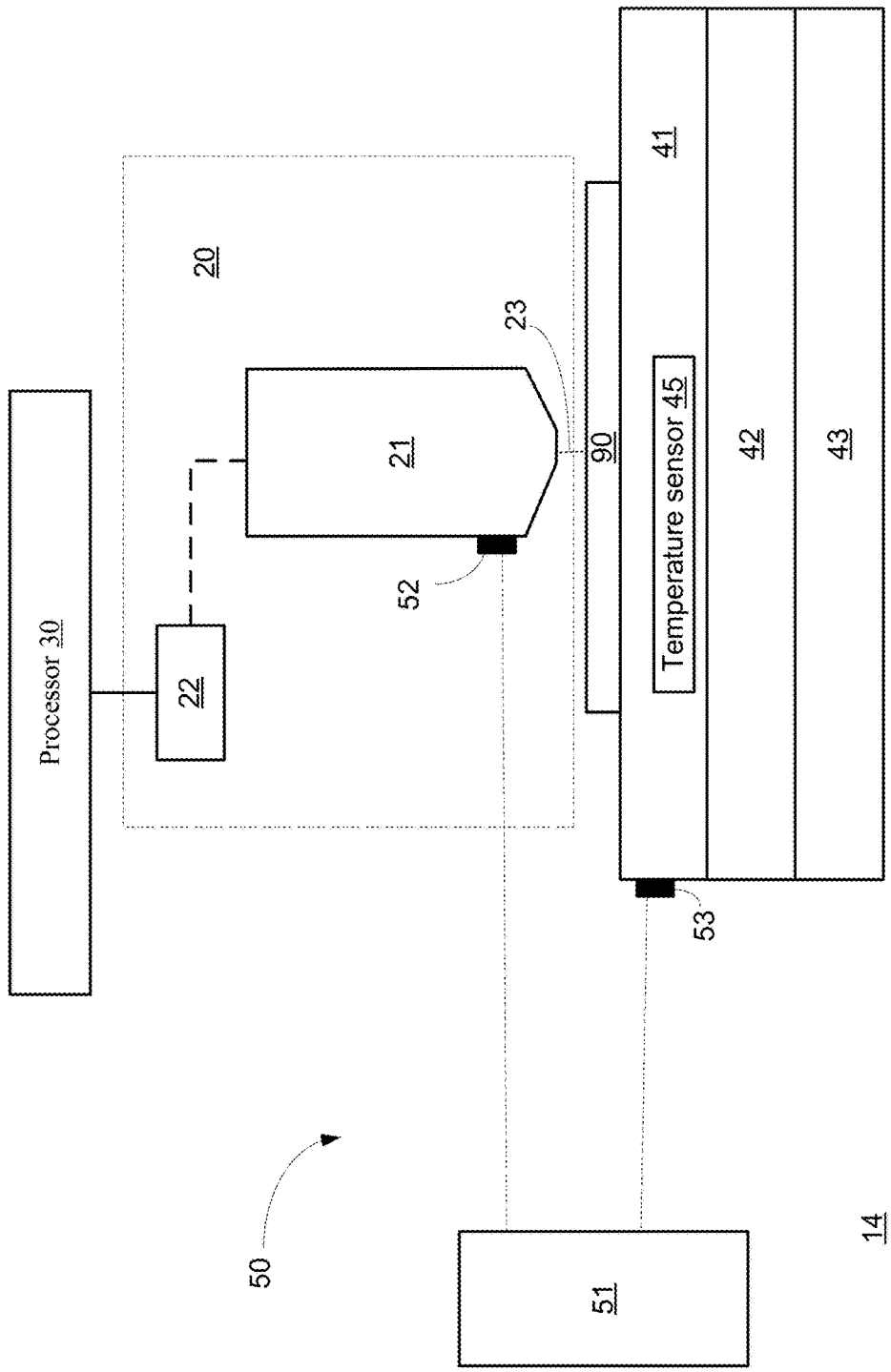
FIG. 4 is a side view of a system according to an embodiment of the invention.

FIG. 4 is a side view of system 14 that supports an object 90 according to an embodiment of the invention. System 14 illustrates the mechanical stage 40 as including a Z-axis stage 41, a Y-axis stage 42 and an X-axis stage 43. The Z-axis stage 41 is located above the Y-axis stage 42 and the X-axis stage 43. The temperature sensor 45 is included in (or connected to) the Z-axis stage 41.

Figure 5:
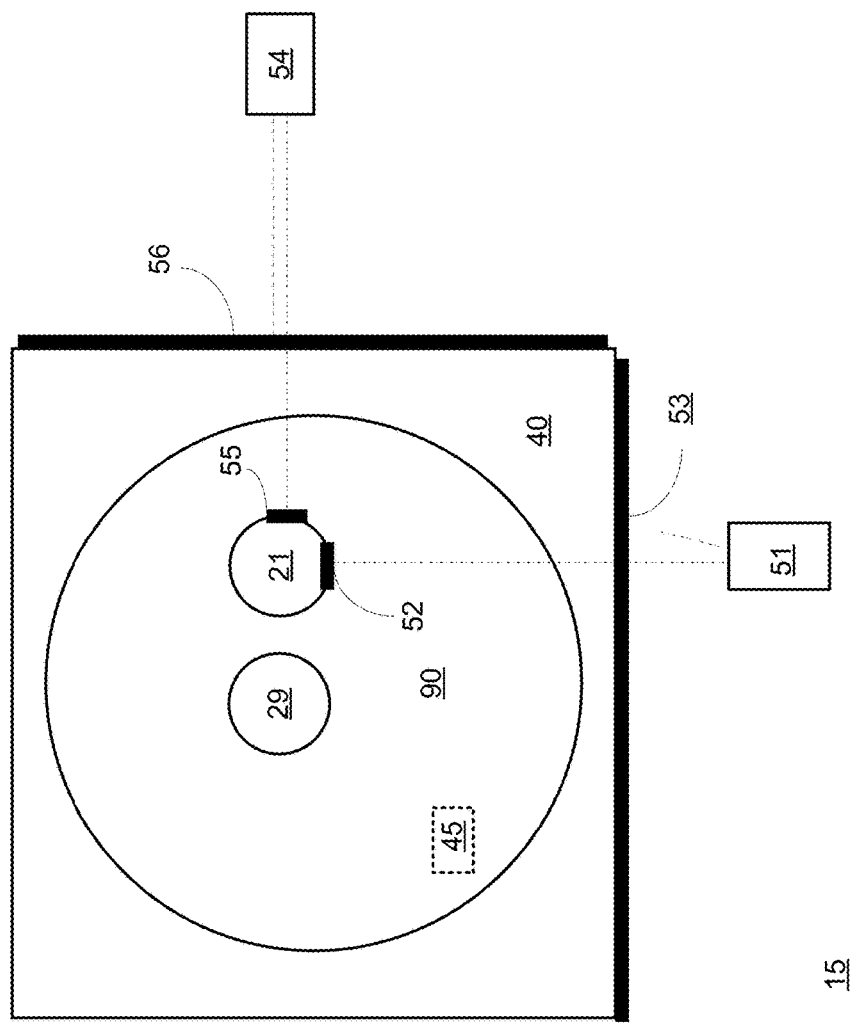
FIG. 5 is a top view of a system according to an embodiment of the invention.

FIG. 5 is a top view of system 15 that supports an object 90 according to an embodiment of the invention. System 15 differs from system 11 by having an optical microscope 29 in addition to optics 21. The optical microscope may be used for various purposes such as object alignment, coarse navigation, defect inspection and the like. In FIG. 5 the temperature sensor 45 is located below object 90.

Figure 6:
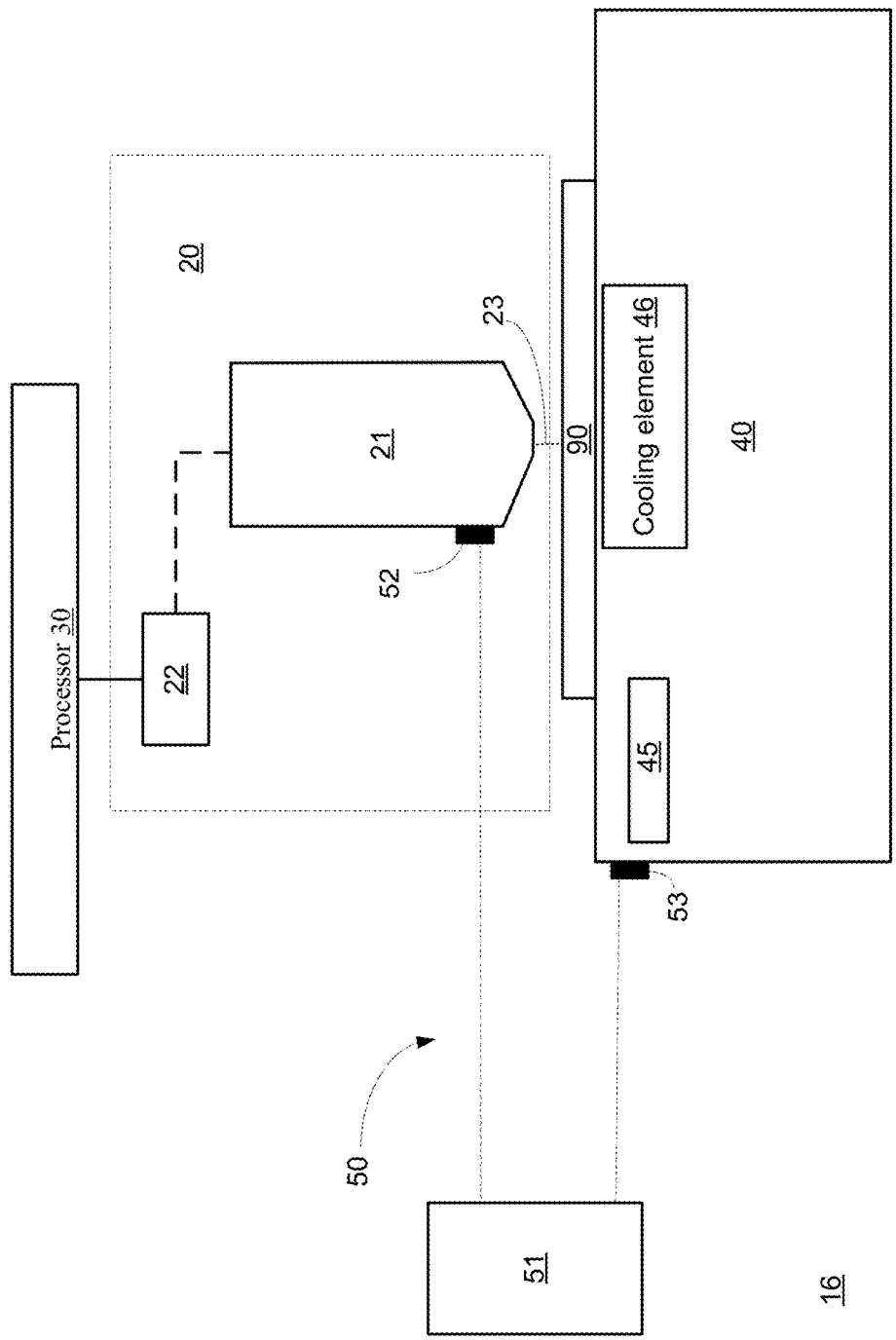
FIG. 6 is a side view of a system according to an embodiment of the invention.

FIG. 6 is a side view of system 16 that supports an object 90 according to an embodiment of the invention. System 16 differs from system 11 by having a cooling element 46 for cooling the mechanical stage 40.

Figure 7:
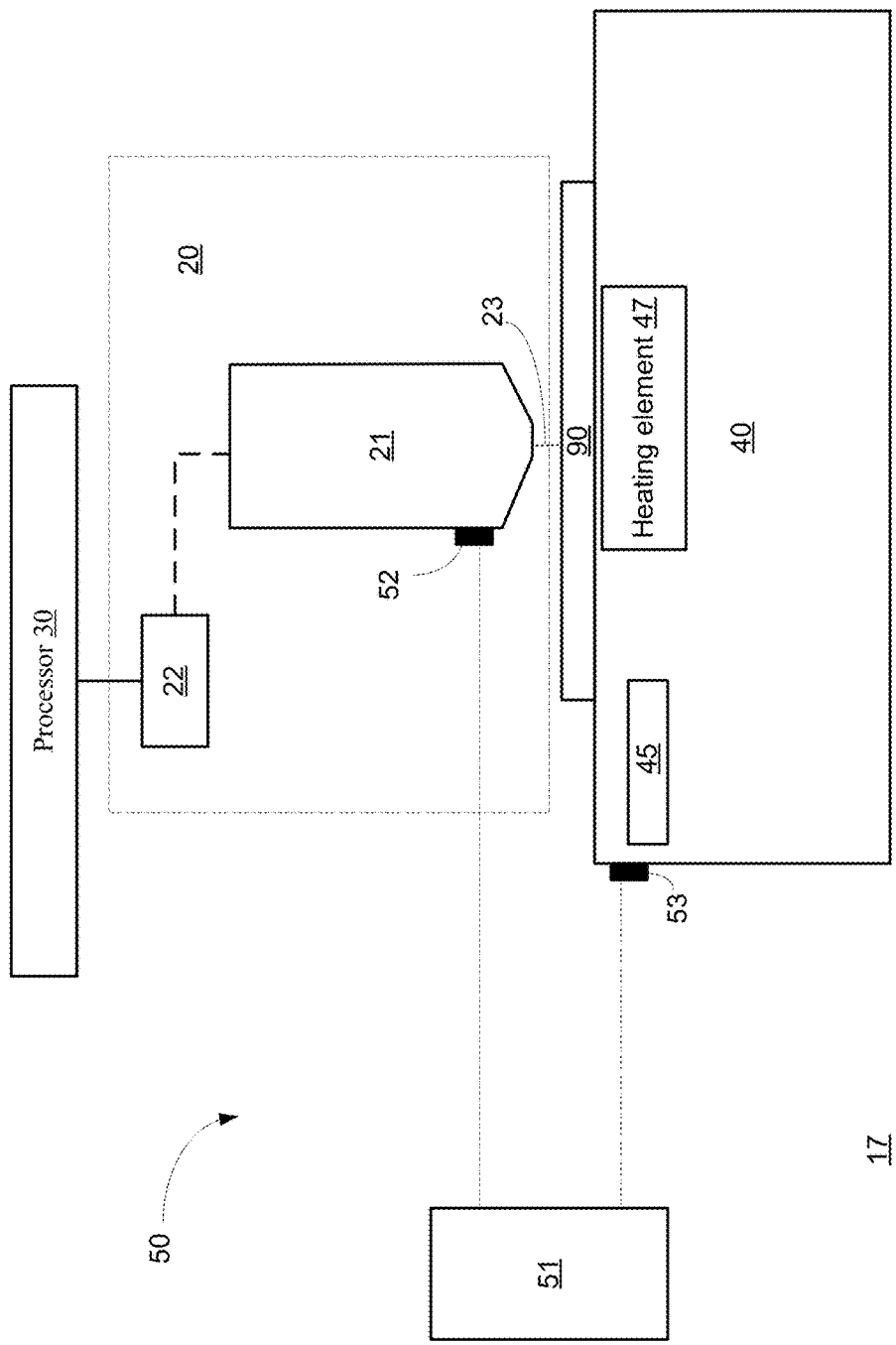
FIG. 7 is a side view of a system according to an embodiment of the invention.

FIG. 7 is a side view of system 17 that supports an object 90 according to an embodiment of the invention. System 17 differs from system 11 by having a heating element 47 for heating the mechanical stage 40.

At least one of the heating element 47 of system 17 and the cooling element of system 16 may be used to control the temperature of the mechanical stage 40 and especially to reduce changes in the temperature of the mechanical stage 40. This reduction may reduce the fluctuations in location errors.

Figure 8:
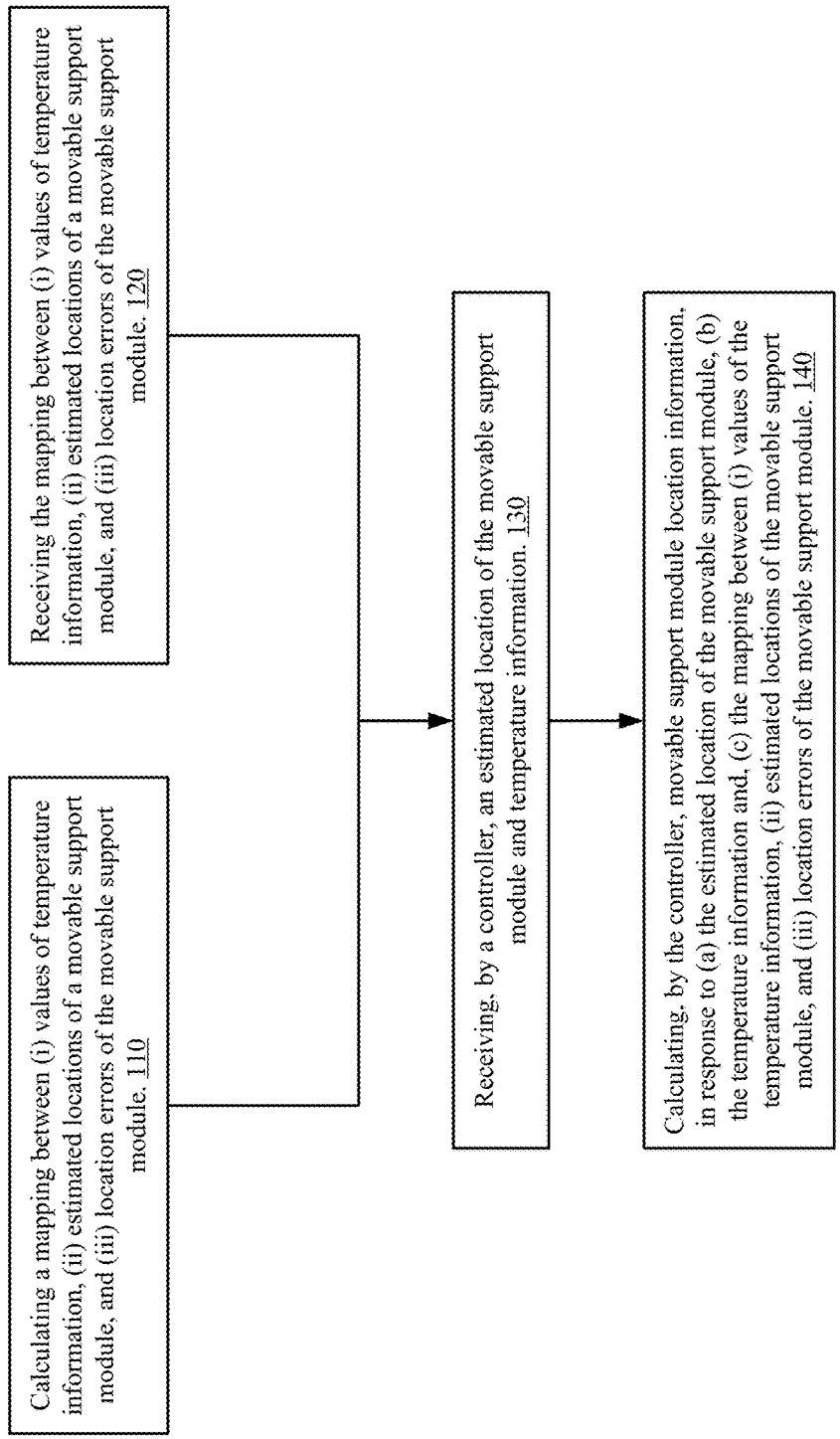
FIG. 8 illustrates a method according to an embodiment of the invention.

FIG. 8 illustrates method 100 according to an embodiment of the invention. Method 100 may start by steps 110 or 120. Step 110 may include calculating a mapping between (i) values of temperature information, (ii) estimated locations of a movable support module, and (iii) location errors of the movable support module.

The temperature information is about an actual or estimated temperature of at least a portion of the object support module.

The locations errors of the movable support module represent differences between the estimated locations of the movable support module and the actual locations of the movable support module. The locations errors may be calculated by comparing the estimated locations of the movable support module that are provided by a location monitor and between actual locations of structural elements of interest of an object that is supported by the movable support module. The actual locations of the structural elements may be determined by an inspection or review tool that images the object while the object is supported by the movable support module.

Step 110 may include measuring the location errors of the movable support module at different actual or estimated temperatures of the movable support module. This may include scanning the entire object by an inspection or review tool.

Step 110 may include heating the movable support module by a heating element to obtain at least some of the different actual or estimated temperatures of the movable support module.

Step 110 may include heating the movable support module by moving the movable support module during a period of time that exceeds a predetermined threshold (for example—half an hour) to obtain at least some of the different actual or estimated temperatures of the movable support module:

Step 110 may include cooling the movable support module by a cooling element to obtain at least some of the different actual or estimated temperatures of the movable support module.

Step 110 may include estimating a relationship between an actual temperature sensed by a temperature sensor and an estimated temperature of a part of the location monitor. The location monitor provides the actual location of the movable support module.

Step 110 may be regarded as a calibration phase. During the calibration phase the mechanical stage may be heated and cooled and the location errors as function of temperature of the mechanical stage is learnt. The calibration phase can include one or more calibration iterations, whereas the outcome of multiple calibration phases may be averaged of processed in any other manner.

The calibration phase may be executed once or multiple times during the lifespan of the mechanical stage. For example—the calibration phase may be repeated in a periodical manner, in response to events (such as an increase in the number and/or magnitude of location errors), in a random or in a pseudo-random manner.

Step 120 may include receiving the mapping between (i) values of temperature information, (ii) estimated locations of a movable support module, and (iii) location errors of the movable support module.

Steps 110 and 120 may be followed by step 130 of receiving, by a controller, an estimated location of the movable support module and temperature information.

Step 130 may include receiving the temperature information from a temperature sensor that senses a temperature of a certain portion of the object support module.

Step 130 may include receiving the temperature information from multiple temperature sensors that sense temperatures of certain portions of the object support module.

Step 130 may include receiving temperature timing information about a timing of acquisition of the temperature information.

Step 130 may include receiving the temperature information from a temperature sensor that is embedded in a Z axis stage.

Step 130 may be followed by step 140 of calculating, by the controller, movable support module location information, in response to (a) the estimated location of the movable support module, (b) the temperature information and, (c) the mapping between (i) values of the temperature information, (ii) locations of the movable support module, and (iii) location errors of the movable support module.

Step 140 may include, for example, applying at least one of the following functions:

$$Correct(X,Y)=MAP\{Estimated(X,Y), Temperature\}.$$

$$Correct(X,Y)=MAP\{Estimated(X,Y), Temperature, Timestamps\}.$$

$$Correct(X,Y)=MAP\{Estimated(X,Y), Temperature, Delta\text{-}Temperature\}.$$

Step 140 may also include calculating a location of an optical axis of an inspection or review tool in response to movable support module location information.

Step 140 may also include calculating the movable support module location information in response to temperature timing information.

Step 140 may also include calculating a change of the temperature information over time.

Step 140 may also include calculating the movable support module location information in response to the change of the temperature timing information over time.

Steps 130 and 140 may be regarded as a run time-phase in which the location errors are corrected according to the mapping that was previously received and/or calculated. The mapping may also be updated according to outcomes of the runtime phase—taking into account location errors that were detected during the runtime phase. Averaging or filtering of errors and outliers removal are beneficial in order not to introduce errors in the mapping.

According to an embodiment of the invention, step 110 may include calculating temperature patterns that are expected to be obtained during certain scan patterns. For example—the movable support module may gradually heat (by certain degrees) during a raster scan of the entire object.

Yet for another example, changes in the speed of the movable support module (for example changing from a X axis movement to a Y axis movement) may cause the movable support module to heat.

Yet for another example, slowing the movement of the movable support module or even maintaining a constant speed across a scan line may reduce the temperature of the movable support module.

Any temperature pattern may be taken into account (during step 140) when a certain scan pattern is detected.

FIG. 9 illustrates location errors before applying a temperature sensitive location error correction. FIG. 9 includes a map 200 in which each location error of a wafer is represented by an out of scale arrow having a size and a direction that are indicative of a size and direction of the location error.

FIG. 9 also illustrates a first graph 210 that represents statistics of location errors along an Y-axis of the wafer. The x-axis of the first graph 210 is indicative of sizes of location errors (in microns) and the y-axis of the first graph 210 is indicative of the position (in decimeters) of the location errors along the Y-axis of the wafer. The decimeters are represented by microns multiplied by 105.

FIG. 9 also illustrates a second graph 220 that represents statistics of location errors along an X-axis of the wafer. The y-axis of the second graph 220 is indicative of sizes of location errors (in microns) and the x-axis of the second graph 220 is indicative of the position (in decimeters) of the location errors along the X-axis of the wafer. The decimeters are represented by microns multiplied by 105.

Figure 10:
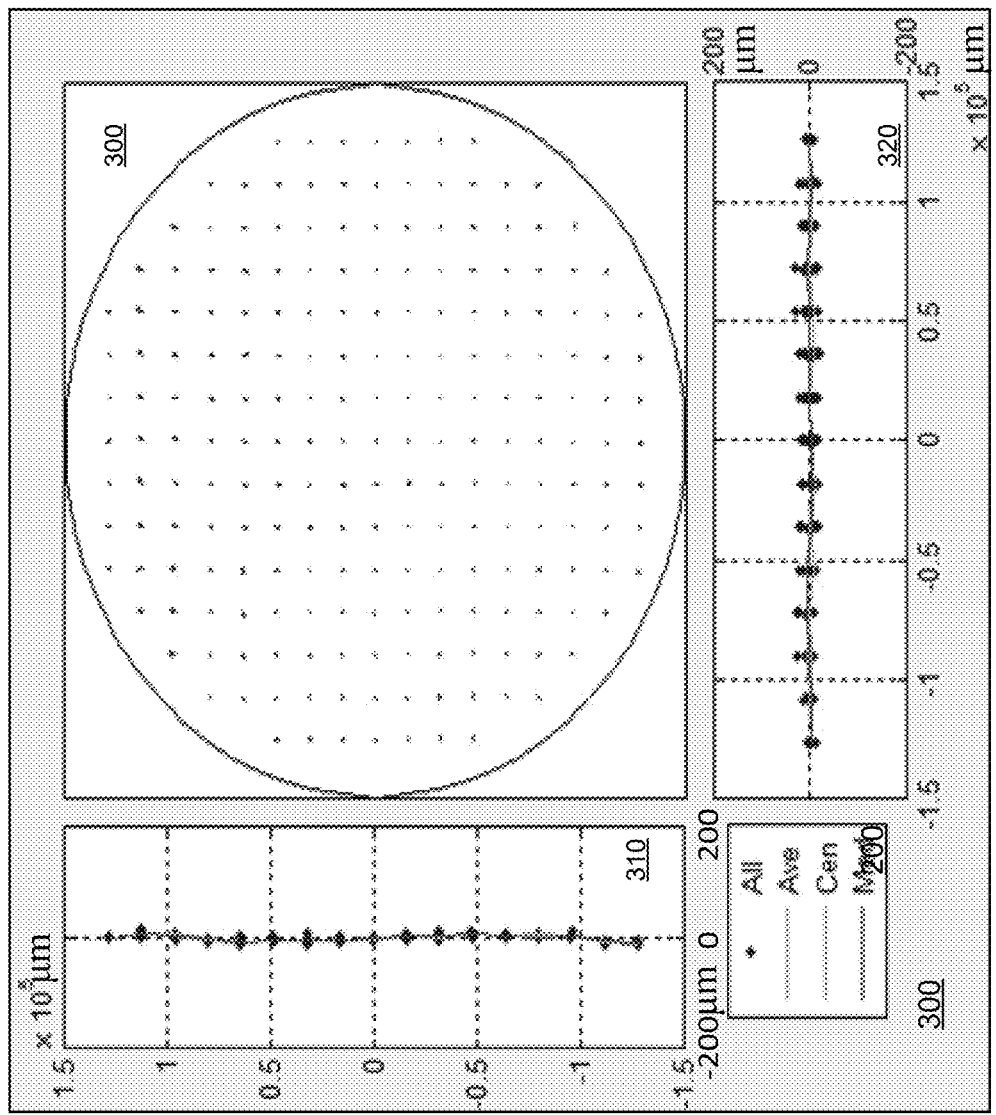
FIG. 10 illustrates location errors before applying a temperature sensitive location error correction according to an embodiment of the invention.

FIG. 10 illustrates location errors after applying a temperature sensitive location error correction according to an embodiment of the invention. FIG. 10 includes a map 300 in which each location error is represented by an out of scale arrow having a size and a direction that are indicative of a size and direction of the location error. The arrows of map 300 are substantially smaller than those of map 200.

FIG. 10 also illustrates a first graph 310 that represents statistics of location errors along an Y-axis of the wafer. The x-axis of the first graph 310 is indicative of sizes of location errors (in microns) and the y-axis of the first graph 310 is indicative of the position (in decimeters) of the location errors along the Y-axis of the wafer. The decimeters are represented by microns multiplied by 105.

A comparison between first graph 210 of FIG. 9 and first graph 310 of FIG. 10 illustrates that the sizes of the location errors along the Y-axis of wafer of FIG. 10 are much smaller than the sizes of the location errors along the Y-axis of wafer of FIG. 9.

A comparison between second graph 220 of FIG. 9 and second graph 320 of FIG. 10 illustrates that the sizes of the location errors along the X-axis of the wafer of FIG. 10 are much smaller than the sizes of the location errors along the X-axis of the wafer of FIG. 9.

FIG. 10 also illustrates a second graph 320 that represents statistics of location errors along an X-axis of the wafer. The y-axis of the second graph 320 is indicative of sizes of location errors (in microns) and the x-axis of the second graph 320 is indicative of the position (in decimeters) of the location errors along the X-axis of the wafer. The decimeters are represented by microns multiplied by 105.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may cause the storage system to allocate disk drives to disk drive groups.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a non-transitory computer readable medium. All or some of the computer program may be provided on computer readable media permanently, removable or remotely coupled to an information processing system. The computer readable media may include, for example and without limitation, any number of the following: magnetic storage media including disk and tape storage media; optical storage media such as compact disk media (e.g., CD ROM, CD R, etc.) and digital video disk storage media; nonvolatile memory storage media including semiconductor-based memory units such as flash memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A substrate inspection system comprising:
   a mechanical stage configured to move and support an object that undergoes non-homogenous and non-linear deformation during a substrate inspection process;
   an image acquisition module including beam optics configured to direct a beam of electrons or ions towards the object during the substrate inspection process along an optical axis;
   a location monitor comprising laser optics and configured to generate data representing an estimated location of the optical axis relative to the mechanical stage during the substrate inspection process;
   a temperature sensor operatively coupled to measure temperature information of at least a portion of the mechanical stage during the substrate inspection process; and
   a controller configured to, during the substrate inspection process:
   receive the data representing the estimated location of the optical axis relative to the mechanical stage from the location monitor, and to receive the temperature information about an actual or estimated temperature of the at least a portion of the mechanical stage;

calculate mechanical stage location information indicative of an actual location of the optical axis within X and Y planes relative to the mechanical stage, in response to (a) the estimated location of the optical axis relative to the mechanical stage, (b) the temperature information and, (c) a mapping between (i) values of the temperature information, (ii) estimated locations of the mechanical stage, and (iii) location errors of the mechanical stage that represent differences between the estimated locations of the mechanical stage and actual locations of the mechanical stage as measured during a calibration phase; and use the mechanical stage location information in performing the substrate inspection process to compensate for the non-homogenous and non-linear deformation of the object.

2. The system according to claim 1 wherein the controller is configured to calculate the mapping.

3. The system according to claim 1 wherein the mechanical stage is configured to move the object in relation to the beam optics.

4. The system according to claim 3 wherein the location monitor further comprises a first mirror coupled to the beam optics and a second mirror coupled to the mechanical stage and wherein the laser optics are arranged to direct a first laser beam towards the first mirror and direct a second laser beam towards the second mirror.

5. The system according to claim 1 wherein optics comprise charged particle optics that illuminate the object with an electron beam.

6. A method for controlling an object inspection process using temperature sensitive location error compensation, the method comprising:

supporting an object that undergoes non-homogenous and non-linear deformation on a mechanical stage;

directing a beam of electrons or ions, with an image acquisition module including beam optics, towards the object during the object inspection process along an optical axis;

measuring a temperature of at least one point of the mechanical stage;

receiving, by a controller, an estimated location of the mechanical stage that supports an object, and temperature information about an actual or estimated temperature of at least a portion of the object support module; and calculating, by the controller during the object inspection process, mechanical stage location information indicative of an actual location of the optical axis within X and Y planes relative to the mechanical stage, in response to (a) the estimated location of the mechanical stage, (b) the temperature information, and (c) a mapping between (i) values of the temperature information, (ii) locations of the mechanical stage, and (iii) location errors of the mechanical stage that represent differences between the estimated locations of the mechanical stage and actual locations of the mechanical stage as measured during a calibration phase; and using the mechanical stage location information in performing the substrate inspection process to compensate for the non-homogenous and non-linear deformation of the object.

7. The method according to claim 6 comprising calculating a location of an optical axis of an inspection or review tool in response to the movable support module location information.

8. The method according to claim 6 comprising generating the mapping by measuring the location errors of the movable support module at different actual or estimated temperatures of the movable support module.

9. The method according to claim 8 comprising heating the movable support module by a heating element to obtain at least some of the different actual or estimated temperatures of the movable support module.

10. The method according to claim 8 comprising heating the movable support module by moving the movable support module during a period of time that exceeds a predetermined threshold to obtain at least some of the different actual or estimated temperatures of the movable support module.

11. The method according to claim 8 comprising cooling the movable support module by a cooling element to obtain at least some of the different actual or estimated temperatures of the movable support module.

12. The method according to claim 8 wherein the estimated location of the movable support module is provided by a location monitor; wherein the temperature information is provided by a temperature sensor that is located at a certain position; wherein the generating of the mapping comprises estimating a relationship between a temperature sensed by the temperature sensor and a temperature of a part of the location monitor.

13. The method according to claim 6 comprising receiving the temperature information from a temperature sensor that senses a temperature of a certain portion of the object support module.

14. The method according to claim 6 comprising receiving the temperature information from multiple temperature sensors that sense temperatures of certain portions of the object support module.

15. The method according to claim 6 further comprising receiving temperature timing information about a timing of acquisition of the temperature information; and wherein the calculating of the movable support module location information is also responsive to the temperature timing information.

16. The method according to claim 15 further comprising calculating a change of the temperature information over time; and wherein the calculating of the movable support module location information is also responsive to the change of the temperature timing information over time.

17. The method according to claim 6 further comprising:

receiving or calculating a relationship between a scan pattern that is followed by the movable support module and between temperatures obtained during the scan pattern;

detecting that the movable support module started to follow the scan pattern; and calculating the movable support module location information in response to the relationship.

18. The method according to claim 6 wherein the movable support module comprises an X-Y axis stage and a Z axis stage; wherein the movable support module location information is indicative of a location of the movable support module within an X-Y plane; and wherein the temperature information is provided by a temperature sensors embedded in the Z axis stage.

19. A substrate inspection system comprising:
a mechanical stage configured to move and support an object that undergoes non-homogenous and non-linear deformation during a substrate inspection operation;
an image acquisition module including beam optics configured to direct a beam towards the object during an inspection process along an optical axis;
a location monitor comprising laser optics and configured to generate data representing an estimated location of the optical axis relative to the mechanical stage;
a temperature sensor operatively coupled to measure temperature information of at least a portion of the mechanical stage; and
a controller configured to:
receive the data representing the estimated location of the optical axis relative to the mechanical stage from the location monitor, and to receive the temperature information about an actual or estimated temperature of the at least a portion of the mechanical stage;
calculate mechanical stage location information, in response to (a) the estimated location of the optical axis relative to the mechanical stage, (b) the temperature information and, (c) a mapping between values of the temperature information, estimated locations of the mechanical stage, and location errors of the mechanical stage that represent differences between the estimated locations of the mechanical stage and actual locations of the mechanical stage as measured during a calibration phase; and
use the mechanical stage location information in performing the substrate inspection process to compensate for the non-homogenous and non-linear deformation of the object; wherein:
the mechanical stage is configured to move the object in relation to the beam optics;
the location monitor further comprises a first mirror coupled to the beam optics and a second mirror coupled to the mechanical stage and wherein the laser optics are arranged to direct a first laser beam towards the first mirror and direct a second laser beam towards the second mirror;
reflected beams from the first mirror and second mirror form an interference pattern;
the location monitor processes the interference pattern to determine a distance between the first mirror and the second mirror; and
the distance reflects the estimated location of the mechanical stage.

\* \* \* \* \*